US010366803B2

(12) United States Patent
Hitosugi

(10) Patent No.: US 10,366,803 B2
(45) Date of Patent: Jul. 30, 2019

(54) METAL OXIDE THIN FILM, METHOD FOR DEPOSITING METAL OXIDE THIN FILM AND DEVICE COMPRISING METAL OXIDE THIN FILM

(71) Applicant: PLANSEE SE, Reutte (AT)

(72) Inventor: Taro Hitosugi, Sendai (JP)

(73) Assignee: Plansee SE, Reutte (AT)

( * ) Notice: Subject to any disclaimer, the term of this patent is extended or adjusted under 35 U.S.C. 154(b) by 0 days.

(21) Appl. No.: 15/521,907

(22) PCT Filed: Nov. 5, 2015

(86) PCT No.: PCT/EP2015/002229
§ 371 (c)(1),
(2) Date: Apr. 26, 2017

(87) PCT Pub. No.: WO2016/071000
PCT Pub. Date: May 12, 2016

(65) Prior Publication Data
US 2017/0316847 A1   Nov. 2, 2017

(30) Foreign Application Priority Data
Nov. 7, 2014   (EP) ..................... 14192219

(51) Int. Cl.
*H01B 1/08*   (2006.01)
*C23C 14/08*   (2006.01)
(Continued)

(52) U.S. Cl.
CPC ............. *H01B 1/08* (2013.01); *C04B 35/495* (2013.01); *C04B 35/62218* (2013.01);
(Continued)

(58) Field of Classification Search
None
See application file for complete search history.

(56) References Cited

U.S. PATENT DOCUMENTS

| 4,753,916 A | 6/1988 | Carcia et al. |
| 8,183,764 B2 | 5/2012 | Shoda et al. |

(Continued)

FOREIGN PATENT DOCUMENTS

| AT | 11941 U1 | 7/2011 |
| EP | 0852266 | 7/1998 |

(Continued)

OTHER PUBLICATIONS

U.S. Department of Energy, "Critical Materials Strategy", Dec. 2010.
(Continued)

*Primary Examiner* — Katie L. Hammer
(74) *Attorney, Agent, or Firm* — Laurence A. Greenburg; Werner H. Stemer; Ralph E. Locher

(57) ABSTRACT

A metal oxide thin film formed of $\beta$-$MoO_3$ includes at least one doping element of the group Re, Mn, and Ru. Further, there is described a method of producing such a metal oxide thin film via sputtering and a thin film device with a metal oxide thin film of $\beta$-$MoO_3$ that includes at least one doping element selected from the group Re, Mn, and Ru.

17 Claims, 4 Drawing Sheets

(51) Int. Cl.
- C23C 14/34 (2006.01)
- C23C 14/58 (2006.01)
- E06B 9/24 (2006.01)
- G02F 1/15 (2019.01)
- G02F 1/1333 (2006.01)
- C04B 35/495 (2006.01)
- C04B 35/622 (2006.01)
- C09K 9/00 (2006.01)
- G02F 1/1523 (2019.01)

(52) U.S. Cl.
CPC ............... *C09K 9/00* (2013.01); *C23C 14/083* (2013.01); *C23C 14/085* (2013.01); *C23C 14/3414* (2013.01); *C23C 14/3464* (2013.01); *C23C 14/5806* (2013.01); *E06B 9/24* (2013.01); *G02F 1/1523* (2013.01); *E06B 2009/247* (2013.01); *G02F 1/13338* (2013.01); *G02F 2202/06* (2013.01)

(56) References Cited

U.S. PATENT DOCUMENTS

| | | | |
|---|---|---|---|
| 8,405,629 B2 | 3/2013 | Reinfried et al. | |
| 2002/0121700 A1* | 9/2002 | Tallon | B82Y 30/00 257/758 |
| 2007/0071985 A1 | 3/2007 | Kumar et al. | |
| 2010/0243427 A1* | 9/2010 | Kozlowski | C03C 17/3417 204/192.1 |
| 2012/0160663 A1* | 6/2012 | Gillaspie | C23C 14/0057 204/192.15 |

FOREIGN PATENT DOCUMENTS

| | | |
|---|---|---|
| JP | S6070421 A | 4/1985 |
| JP | 2005179115 A | 7/2005 |
| JP | 2010103460 A | 5/2010 |
| WO | 2005040044 A2 | 5/2005 |

OTHER PUBLICATIONS

U.S. Department of Energy, "Critical Materials Strategy", Dec. 2011.

Benjamin P. Hahn et al., "Electrochemical synthesis and characterization of mixed molybdenum-rhenium oxides", Sep. 1, 2010, pp. 6917-6925.

David Cheyns et al., "Structure induced conductivity enhancement in metal-doped molybdenum oxide thin films", Jan. 28, 2013, pp. 43109-43109.

M. Dhanasankar et al., "Enhanced electrochromism in cerium doped molybdenum oxide thin films", Dec. 1, 2010, pp. 1969-1972.

Shailja Tiwari et al., "Effect of oxygen partial pressure and Fe doping on growth and properties of metallic and insulating molybdenum oxide thin films", Apr. 15, 2012, pp. 83905-83905.

S. S. Mahajan et al., "Structural, optical and electrochromic properties of Nb-doped $MoO_3$ thin films", Jul. 15, 2008, pp. 5895-5898.

Hai-Qiao Wang et al., "Up-conversion semiconducting $MoO_3$:Yb/Er nanocomposites as buffer layer in organic solar cells", Jun. 3, 2012, pp. 196-201.

Paul M. S. Monk et al., "The effect of doping electrochromic molybdenum oxide with other metal oxides: Correlation of optical and kinetic properties", Aug. 1, 1995, pp. 75-85.

A. D. Sayede et al., "An ab initio LAPW study of the α and β phases of bulk molybdenum trioxide, $MoO_3$", Sep. 19, 2005, p. 72.

U.S. Department of Energy, "Critical Materials Strategy", Jan. 10, 2012.

Leon I. Maissel, et al., "Handbook of Thin Film Technology", International Business Machines Corporation Components Division, East Fishkill Facility Hopewell Junction, N.Y.

* cited by examiner

METAL OXIDE THIN FILM, METHOD FOR DEPOSITING METAL OXIDE THIN FILM AND DEVICE COMPRISING METAL OXIDE THIN FILM

BACKGROUND OF THE INVENTION

Field of the Invention

The present invention relates to a metal oxide thin film, a method for depositing such a metal oxide thin film and a device comprising such a metal oxide thin film.

In the last years, research on oxide thin films, especially metal oxide thin films and possible applications therefor has become a lucrative and interesting field. Metal oxide thin films are promising candidates for the use in all kinds of electronic and optic devices, often owing to their unique combination of high electrical conductivity, i.e. low electrical resistivity, and high optical transmittance. For example, such metal oxide thin films are widely used in flat panel displays, photovoltaics, multifunctional windows (e.g., low-e or electrochromic), antistatic coatings, portable and/or flexible electronics and of course transistors, especially thin film transistors (TFT). If such oxides exhibit an especially high electrical conductivity and similarly an especially high optical transmittance, they are also called transparent conductive oxides (TCO).

Examples for most common and widely used TCOs are, e.g., tin oxide with fluorine doping, zinc oxide with aluminium doping and, indium tin oxide (ITO). In the recent years and driven by their increased importance and potential, a wide variety of other TCO materials, both crystalline and amorphous has been established and their properties have been tailored and optimized. Nowadays, most transparent conductive films are produced from the TCO materials ITO, indium zinc oxide (IZO), aluminium zinc oxide (AZO) or fluorine-doped tin oxide (FTO) but also electrically conductive polymers or similar materials are possible alternatives.

ITO is favoured for optoelectronic applications because of its especially advantageous combination of high optical transmittance and low electrical resistivity within this class of materials. Unfortunately, ITO, and also the other In-containing TCOs, bear the major disadvantage of a high In price, volatile In price levels, and also, the classification of In as a critical material, e.g., in the US Department of Energy's "Critical Metals Strategy" of 2010 and 2011. Hence, there have been various approaches to find substitutes for the use of ITO in all fields of oxide thin film and especially TCO applications.

One possible candidate for such metal oxide thin films is molybdenum dioxide, MoO2. For example, the US2007/0071985A1 describes the possibility of mixing MoO2 with other TCO forming oxides like In2O3, SnO2, or ZnO to reduce their cost. The WO2005/040044A2 describes pure or almost pure MoO2 thin films for the use in organic light-emitting diodes (OLED), liquid crystal displays (LCD), plasma display panels (PDP), field emission displays (FED), thin film solar cells, low resistivity ohmic contacts, and other electronic and semiconductor devices. The described MoO2 thin films have a mean transmission of greater than 85% at a wavelength $\lambda$ from 350 to 800 nm and values for the resistivity of less than 500 $\mu\Omega\cdot$cm, in some cases less than 300 $\mu\Omega\cdot$cm and in other cases less than 250 $\mu\Omega\cdot$cm, but typically greater than 1 $\mu\Omega\cdot$cm are stated. This lower limit of 1 $\mu\Omega\cdot$cm should nevertheless be questioned, as even the best metallic conductor, silver (Ag), exhibits a resistivity of 1.6 $\mu\Omega\cdot$cm in bulk form, and the resistivity of thin films is typically at least a factor of 1.5 to 2 higher than the bulk value, due to higher impurity levels and a less perfect crystal lattice (dislocations, small grain size). In addition, these low resistivities can be partly attributed to the fact that MoO2 is a $d^2$-system (having 2 electrons in the d-orbital). Unfortunately, the reported values for the resistivity and for the mean transmission of 85% or higher are not directly assigned to respective film thicknesses. The described films can have a thickness of between 0.5 nm to 10 μm, or 50 Å to 2500 Å, but as both the resistivity and the mean transmission strongly depend on film thickness the given values are of limited informative value.

Another possibility is the use of sub-oxides of different metals, which are for example described in the EP0852266A1 for the realization of transparent thin oxide films with high refractive indexes of 2.3 or 2.4 at 633 nm.

Another promising candidate for such metal oxide thin films is molybdenum trioxide, MoO3. There are two most common polymorphs of MoO3, the orthorhombic α-MoO3 and the monoclinic β-MoO3. The α-MoO3 phase is the thermodynamically stable phase, and its properties and applications have been widely studied both in bulk, in thin film form, as well as the effects of doping.

The β-MoO3 phase is a metastable phase which is difficult to synthesize, especially in an epitaxial form and has only recently become subject of serious studies. An earlier mentioning of the deposition of a β-MoO3 film can be found in the U.S. Pat. No. 4,753,916A. There it is also described, that by generating a mixed oxide β-$Mo_{1-x}W_xO3$ the β-MoO3 phase can be stabilized. The reported films deposited from the β-$Mo_{1-x}W_xO3$ material show a low absorbance at wavelengths $\lambda$ larger than approximately 450 nm.

Both, the α- and β-MoO3 polymorphs have large band gaps of 3.1 eV and 2.9 eV, respectively, and are transparent insulators, as can be found, e.g., in Sayede et al. "*An ab initio LAPW study of the α and β phases of bulk molybdenum trioxide, MoO3*" Chemical Physics, Volume 316, Issues 1-3, 19 Sep. 2005, p. 72. They are d0-systems, hence having no d-electrons in the conduction band.

There have been attempts to dope the stable α-MoO3 with Al, Au, Yb, or Ag to tune the work function and the electrical conductivity, as can be found in Cheyns et al. "*Structure induced conductivity enhancement in metal-doped molybdenum oxide thin films*", *J. Appl. Phys.* 113, 043109 (2013). It is reported that doping with 2% of Ag leads to a conductivity of $10^{-5}$ S/cm, which corresponds to a resistivity of $10^5$ $\Omega\cdot$cm. The described method works via metal induced crystallization (MIC), which is more similar to a catalytic reaction than to classical electrical doping mechanisms. It aims at a good tunability of the work function, so that the band alignment and the interface to α-MoO3 electrode can be optimized for the use in OLED charge transport layers. The described method starts from amorphous MoO3 films and leads to a polycrystalline structure of α-MoO3 in which grain boundaries supposedly limit the electrical conductivity to the reported values.

SUMMARY OF THE INVENTION

It is an object of the present invention to provide a metal oxide thin film, exhibiting high optical transmittance and low electrical resistivity and a method for depositing such a film. Further, such a metal oxide thin film should not contain In and be cost-efficient.

Optimally, the desired metal oxide thin film should also provide the possibility to tune the resulting properties because each electronic or optoelectronic device requires a unique tailor-made combination of transmittance, refractive index (matching), resistivity and work function among other properties.

Further, such a metal oxide thin film should be chemically stable under ambient environmental conditions, e.g. under UV and/or visible light, air and humidity. It should also be stable on annealing and show good chemical etching behaviour (easy to pattern), have a good adhesion to the used substrate and a reasonable price.

The object is achieved by a metal oxide thin film as claimed as well as by the method as claimed. Advantageous developments are provided by the dependent claims.

With regard to the following, high optical transmittance or transmittance is understood here as meaning that the respective films, or layers or structures comprising such films are transparent, at least to the greatest extent, to light in the visible range, so that the light in the visible range can pass through unhindered, at least to the greatest extent. The visible range of light is to be understood, but not strictly limited to, as a wavelength range of $\lambda=390$ to 700 nm. Optical transmittance is measured via spectrophotometer (JASCO, V-630), which is a standard technique used in many labs.

Further with regard to the following, electrical conductivity is to be understood as the reciprocal of electrical resistivity as it is also common knowledge. Both terms will be used to describe the properties of the metal oxide thin film of the present invention when appropriate. The electrical resistivity is measured via four-point probe measurement, which is a standard technique for resistivity measurement, for example described in "*Handbook of Thin Film Technology*", eds. Maissel and Glang, published by McGraw-Hill Book Company, 1970.

A metal oxide thin film of the present invention comprises $\beta\text{-MoO}_3$, the $\beta\text{-MoO}_3$ comprises at least one doping element of the group Re, Mn, and Ru.

In this regard, the term $\beta\text{-MoO}_3$ is to be understood as the Molybdenum oxide exhibiting the monoclinic $\beta\text{-MoO}_3$ crystal structure and not the stoichiometric $\beta\text{-MoO}3$ oxide in a strict sense. Hence, it also encompasses compositional fluctuations within the homogeneity range of this monoclinic $\beta\text{-MoO}3$ phase, including at least one of the doping elements Re, Mn, and Ru.

As described above, $\beta\text{-MoO}3$ is a transparent insulator with d0 band structure, exhibiting an electrical resistivity of more than $10^7$ $\Omega\cdot$cm (higher resistivities are difficult to determine but it is at least $10^7$ $\Omega\cdot$cm). Hence, in an unmodified state pure $\beta\text{-MoO}3$ would not be suitable for the use as a TCO film. By inserting d-electrons into the conductive band due to doping with at least one element of the group Re, Mn, and Ru, the electrical conductivity of the film can be significantly enhanced and the metal oxide thin film of the present invention is formed. The elements of the group Re, Mn, and Ru have proven to be most effective for doping because of their oxidation state of +6 (in the case of Ru also +7 is possible), thus inserting d-electrons into the valence band and establishing electrical conductivity in the form of a n-type TCO.

In one embodiment of the present invention the metal oxide thin film has a preferred total doping content of the at least one doping element of the group Re, Mn, and Ru of between $0<x\leq10$ at %, more preferably between $0<x<5$ at %, even more preferably between $1\leq x\leq3$ at %. An especially preferred total doping content is $x=1.5$ at %.

According to the simple relation between mobility $\mu_e$ and electrical conductivity $\sigma$, $\sigma=n_e\cdot e\cdot\mu_e$, where e is the elementary charge, electrical conductivity can either be increased by increasing the number density of charge carriers $n_e$, in this case electrons, or their mobility. With a total doping content in the preferred range, the electrical conductivity of $\beta\text{-MoO}3$ can be significantly increased. The reason for this increase is the insertion of electrons into the conduction band, hence increasing their number density $n_e$.

For example, in theory, a doping content of Re of 1 at % in $\beta\text{-MoO}3$ should lead to an increased number density $n_e$ of electrons in the conduction band of $1\times10^{21}$ electrons/cm$^3$. This is a value comparable to the number density of electric charge carriers in ITO of $1\times10^{20}$ to $1\times10^{21}$ electrons/cm$^3$.

Total doping contents of higher than 10 at % can already lead to scattering of electrons and hence to a decrease in mobility and further a reduced electrical conductivity.

A total doping content of $0<x\leq5$ at % and further $1\leq x\leq3$ at % is preferred because within these ranges the combination of high carrier (electron) mobility and low scattering of electrons can be optimally adjusted. Within these ranges the increase in conductivity is most pronounced. It has been found that at a total doping content of approximately 1.5 at %, the conductivity is near a maximum value.

In a preferred embodiment of the present invention the metal oxide thin film is characterized in that the doping element is Re.

Re surprisingly has proven to be especially efficient as a dopant for $\beta\text{-MoO}3$. A possible explanation for this effect could be that Re in its oxide form $ReO_3$ is one of the metal oxides with highest electrical conductivity. $ReO_3$ has a bulk resistivity of only 10 $\mu\Omega\cdot$cm, comparable in fact to metallic Mo with 5 $\mu\Omega\cdot$cm. However, it should be noted that this theory is in no way binding.

The metal oxide thin film of the present invention can be an epitaxial film or also a film with a random crystallographic orientation with respect to the underlying substrate (non-epitaxial film).

During the deposition of thin films, especially on single-crystal substrates, single-crystal films with a fixed crystal orientation related to the substrate's crystal orientation can form via the effect of the periodic arrangement of substrate atoms—this is called epitaxy. The formation of epitaxial films is for example favoured by crystallographic compatibility of deposited film and substrate, a higher mobility of electrons and smooth and clean substrate surfaces.

In a preferred embodiment of the present invention the metal oxide thin film is an epitaxial film. In the form of an epitaxial film, compared to a non-epitaxial, a polycrystalline or an amorphous film, the metal oxide thin film of the present invention exhibits especially high conductivities and high optical transmittance. This effect can be attributed to the absence of grain boundaries and low number of lattice defects in epitaxial films, hence increasing carrier mobility. The fixed crystal orientation is further beneficial for applications when other epitaxial layers are to be deposited on top of a metal oxide thin film of the current invention or if optical properties like polarizing effects are relevant.

In another preferred embodiment of the present invention the metal oxide thin film is a non-epitaxial film. Non-epitaxial growth occurs, e.g., when glass or polymers are used as substrates for metal oxide thin films of the current invention.

In a preferred embodiment of the present invention the metal oxide thin film has an electrical resistivity of below $10^4$ $\Omega\cdot$cm, preferably below $10^3$ $\Omega\cdot$cm, more preferably below $10^2$ $\Omega\cdot$cm. In a most preferred embodiment, the metal oxide thin film's resistivity is below 10 $\Omega\cdot$cm.

By doping $\beta\text{-MoO}3$, which is a transparent insulator as stated above, with at least one element of the group Re, Mn, and Ru, the resistivity of the metal oxide thin film is significantly lowered. The lower the electrical resistivity, while maintaining a high optical transmittance, the more suitable is the metal oxide thin film of the current invention for its applications.

When measuring the optical transmittance of a film deposited on a substrate it is very important to specify which value is really determined. Most suitable for a comparison of different films is a determination of the internal optical transmittance. During the measurement, naturally the transmittance of the whole substrate-film assembly is determined. As an assumption, the reflectance of the substrate and the film can be regarded as equal for the metal oxide thin film of the current invention. In order to determine the internal optical transmittance of the film (i.e., the transmittance of the film alone, without the substrate), the transmittance of the uncoated substrate has to be measured in a first step. From the measured spectrum, the absorption of the uncoated sample can be calculated. In a second step the total transmittance of the metal oxide thin film and substrate assembly has to be measured and the internal optical transmittance of the metal oxide thin film can be calculated by adding the substrate absorption to the total transmittance.

In a preferred embodiment of the present invention the metal oxide thin film has an internal optical transmittance to light in the visible range of more than 90%.

β-MoO3 exhibits a very high internal optical transmittance to light in the visible range of more than 90% in its pure state. Doping it with at least one element of the group Re, Mn, and Ru preferably has only a negligible influence on the resulting metal oxide thin film, which hence also exhibits similarly high internal optical transmittance of more than 90% to light in the visible range. Only when higher respective doping amounts are employed, a slight reduction of the internal optical transmittance of approximately 3 to 4% is possible.

The metal oxide thin film of the present invention shows complex refractive index behaviour (see FIG. 8). Compared to ITO, the refractive index is higher in the ultraviolet and infrared regions and lower in the visible range. This complex refractive index behaviour can be put to use for the design of refractive index matching layers which in the following can increase the efficiency of opto-electronic devices. The refractive index is measured via ellipsometry.

In a preferred embodiment of the present invention the metal oxide thin film has a refractive index of between 1.5 and 2, measured at a wavelength of 550 nm.

In a preferred embodiment of the present invention the metal oxide thin film has a thickness of between 50 and 250 nm.

A thickness of between 50 and 250 nm is especially beneficial because an optimal compromise is established between a high optical transmittance and high electrical conductivity.

In another preferred embodiment of the present invention the metal oxide thin film has a thickness of between 1 and 15 nm Metal oxide thin films of the current invention having a thickness in this range are optimal for the use as antireflective films or also refractive index matching or work function matching layers.

With regard to the following, some basic information is given on the deposition of oxide thin films in general. Oxide thin films (especially TCO films) are typically formed via sputtering, which is a physical vapour deposition (PVD) process. During sputtering or sputter deposition, plasma is generated in a chamber by means of a working gas, e.g., argon. Ions of the working gas are accelerated toward a target formed from coating material and knock particles of the coating material out of the target, which pass into the vapor phase and are deposited therefrom on a substrate to be coated. Other possible methods to deposit oxide thin films are for example chemical vapor deposition (CVD), spray pyrolysis, pulsed laser deposition or thermal evaporation.

According to the present invention a method of producing a metal oxide thin film is characterized in that it comprises the following steps:

Providing a substrate

Providing a target comprising Mo and providing a target comprising at least one element of the group Re, Mn, and Ru or providing a target comprising Mo and at least one element of the group Re, Mn, and Ru Sputtering the target or targets in an inert gas atmosphere optionally comprising up to 40 vol % $O_2$ Suitable substrates for the method of producing a metal oxide thin film are, for example but in no way limited to, glass (e.g., borosilicate glass or alkali glass), polymers, flexible polymers, organic polymers or other organic materials, silicon wafers (amorphous as well as crystalline), Al2O3, SrTiO3, NdGaO3, GaN, GaAs or other semiconductor materials.

Suitable targets, i.e., sputtering targets for the method of the present invention are targets comprising Mo, for example metallic Mo, Mo alloy or molybdenum oxide targets, as well as targets comprising at least one element of the group Re, Mn, and Ru, for example pure metals, metal alloys or oxides of these elements. Such targets can be co-sputtered in accordance to the present invention.

Other suitable targets, i.e., sputtering targets for the method of the present invention are for example targets comprising Mo and at least one element of the group Re, Mn, and Ru. Such a target can be a metallic alloy target, for example a MoRe alloy target. Such a target can also be a molybdenum oxide target comprising at least one doping element of the group Re, Mn, and Ru, for example MoO3 doped with metallic Re. Such a target can also be a mixed oxide target, for example MoO3 mixed with ReO3.

According to the present invention the target or targets provided are sputtered in an inert gas atmosphere optionally comprising up to 40 vol % $O_2$. Possible inert gas atmospheres are Ne, Ar, Kr and Xe or mixtures thereof. Preferably, the inert gas Ar is used as sputter gas, leading to a reasonable sputter yield while having the advantage of low cost and high availability. By optionally adding $O_2$ in a concentration of up to 40 vol % to the sputter gas, reactive sputtering can be achieved, leading to the formation of oxides. By adapting the $O_2$ concentration, the oxidation state and also the resulting oxide structure can be controlled.

Preferably, an inventive method of producing a metal oxide thin film further comprises the following step:

annealing

Preferably, annealing takes place at temperatures of between 50° C. and 400° C. and for between 1 and 10 h. For example annealing can be performed for 5 h at 200° C. in air. Exemplarily, the temperature can be increased from 20° C. to 200° C. with 20° C./min, and after annealing be reduced to room temperature in approximately 10 min.

Preferably, sputtering is performed at pressures of approximately 1 Pa. Further it is preferred, that sputtering takes place at substrate temperatures of below 300° C. Preferred sputtering powers are between 1.5 and 4.5 W/cm². Preferred inert gas (preferably Ar) flow rates are in a range of between 5 and 20 sccm and if O2 is additionally used, the respective O2 flow rates are between 1 and 10 sccm. When using an Ar flow rate of 10 sccm, these O2 flow rates correspond to partial oxygen pressures of 0.09 Pa to 0.5 Pa.

In embodiments of the invention where Re is used as a dopant for the β-MoO3 thin film, it may be the case that not all of the nominal content of Re which is for example comprised in the sputtered target is included in the deposited film. This is because ReO3 is a volatile oxide which is at least partly lost during the sputter process. Via an accurate choice of the deposition parameters, this loss can be reduced. Also when Mn or Ru are used as dopants, similar effects can happen.

The present invention also relates to a thin film device comprising at least one metal oxide thin film according to the invention, hence comprising at least one metal oxide thin film comprising $\beta$-MoO$_3$, comprising at least one doping element of the group Re, Mn, and Ru.

At least one metal oxide thin film is understood here as meaning that the thin film device may also have in addition to the inventive metal oxide thin film one or more further layers of one or more other materials, or else also a number of layers of oxide thin films, e.g. TCOs, may be provided, possibly in combination with one or more other layers. However, it is also possible that the thin film device exclusively consists of one inventive metal oxide thin film deposited on a substrate.

Due to the advantageous combination of high electrical conductivity and high optical transmittance of the inventive metal oxide thin film, such metal oxide thin films are perfectly suited for the use in thin film devices. Thin film devices comprising a metal oxide thin film according to the present invention are optimally suitable for all kinds of thin film/(metal) oxide thin film/TCO applications like touch panels, flat panel displays (thin film transistor (TFT), liquid crystal displays (LCD), inorganic light emitting diodes, organic light emitting diodes (OLED), photovoltaics, multifunctional windows (e.g., electrochromic, low-e, infrared absorbing), devices comprising anti-electrostatic films or also portable and flexible electronics.

In a preferred embodiment, the thin film device of the present invention further comprises a glass or polymer substrate.

In another preferred embodiment, the thin film device of the present invention further comprises a CIGS or a CZTS layer. CIGS and CZTS layers are used as absorbing layer of thin film solar cells, where CIGS comprises a chalcopyrite compound semiconductor of copper indium gallium selenide and/or sulfide and CZTS a similar compound of copper zinc tin selenide and/or sulfide.

In another preferred embodiment, the thin film device of the present invention further comprises a GIGS or CZTS layer and a metallic back contact layer.

In other preferred embodiments, the thin film device of the present invention comprises at least one electrochromic electrode layer and at least one counter electrode layer, separated by one ore more ionically conductive layers, exhibiting high ion conductivity and low electrical conductivity. Such electrochromic electrode and counter electrode layers are sandwiched between TCO layers in these preferred embodiments. Such electrochromic electrode layers may contain one or more of different electrochromic materials, including but not limited to metal oxides. Such metal oxides include tungsten oxide (WO3), molybdenum oxide (MoO3), niobium oxide (Nb2O5), titanium oxide (TiO2), copper oxide (CuO), Iridium oxide (Ir2O3), chromium oxide (Cr2O3), manganese oxide (Mn2O3), vanadium oxide (V2O5), nickel oxide (Ni2O3), cobalt oxide (Co2O3), etc. Such metal oxide can further be doped with one or more dopants such as lithium, sodium, potassium, molybdenum, niobium, vanadium, titanium, and/or other suitable dopants, like metals or metal-containing compounds. The at least one counter electrode layer may contain nickel oxide (NiO), nickel tungsten oxide (NiWO), nickel vanadium oxide, nickel chromium oxide, nickel aluminum oxide, nickel manganese oxide, nickel magnesium oxide, chromium oxide (Cr2O3), manganese oxide (MnO2) or prussian blue (Fe7C18N18). Other possible materials for counter electrodes include cerium titanium oxide, cerium zirconium oxide, and mixtures of oxides, all doped or un-doped.

In another preferred embodiment, the thin film device of the present invention comprises patterned metal layers and TCO layers on a substrate, acting as a resistive or capacitive touch sensor. The metal layers may comprise aluminium, copper, silver, molybdenum, titanium, niobium, tungsten, chromium, tantalum, nickel, and the like, including alloys.

In another preferred embodiment, the thin film device of the present invention further comprises one or more patterned or unpatterned TCO layers on a substrate with high electrical conductivity and high optical transmittance, the TCO layers acting as a shield for electromagnetic radiation.

Preferred uses of the metal oxide thin film of the present invention are for thin film solar cells, electrochromic windows, touch panels and shields for electromagnetic radiation.

For the use in an electrochromic window it is very important, that the metal oxide thin film exhibits high optical transmittance in the visible range. In addition, it can be beneficial if the film exhibits high reflectance in the infrared wavelength range, if the heat from the sun should be kept outside of the building.

For the use in a touch panel, it is very important that the metal oxide thin film exhibits high optical transmittance in the visible range and has high electrical conductivity; in addition, easy patterning by wet etching in common wet etchants (e.g. a mixture of phosphoric acid, acetic acid and nitric acid) should be possible. Further, a sufficiently high corrosion resistance is necessary; to ensure that ambient humidity or also sweat will not adversely affect the touch panel performance or its service life.

BRIEF DESCRIPTION OF THE SEVERAL VIEWS OF THE DRAWING

Further advantageous developments and configurations are provided by the following description of embodiments with reference to the accompanying drawings.

DESCRIPTION OF THE INVENTION

Comparative Example 1—Undoped β-MoO3

A β-MoO3 thin film was deposited via reactive DC magnetron sputtering by using a Mo target on an (100) oriented SrTiO3 (STO) substrate. The employed power was 2.5 W/cm$^2$, pressure 1.0 Pa, deposition temperature 200° C. and the Ar flow rate was 10 sccm, $O_2$ flow rate was 2.5 sccm.

Figure 3:
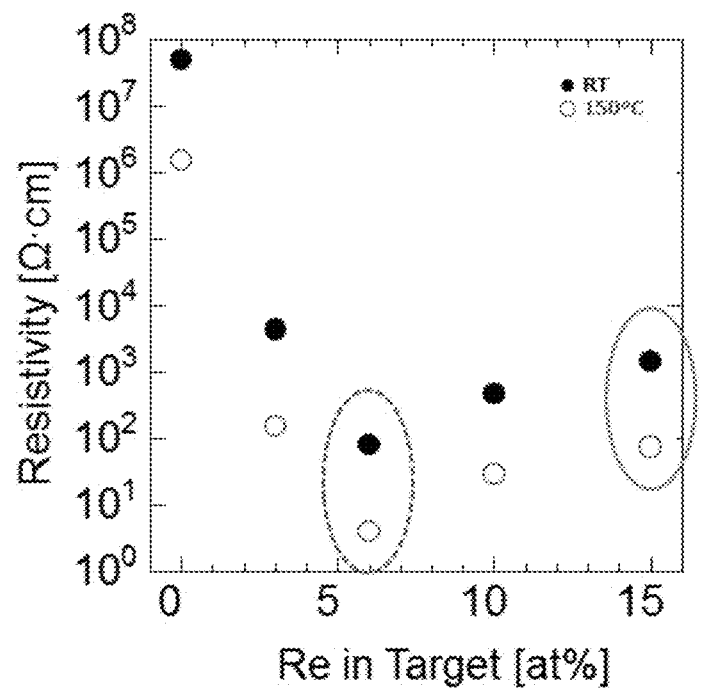
FIG. 3 Resistivity of β-MoO3 vs. doping content of Re in sputtered target in at % (First to fourth embodiment and comparative example 1).
Figure 4:
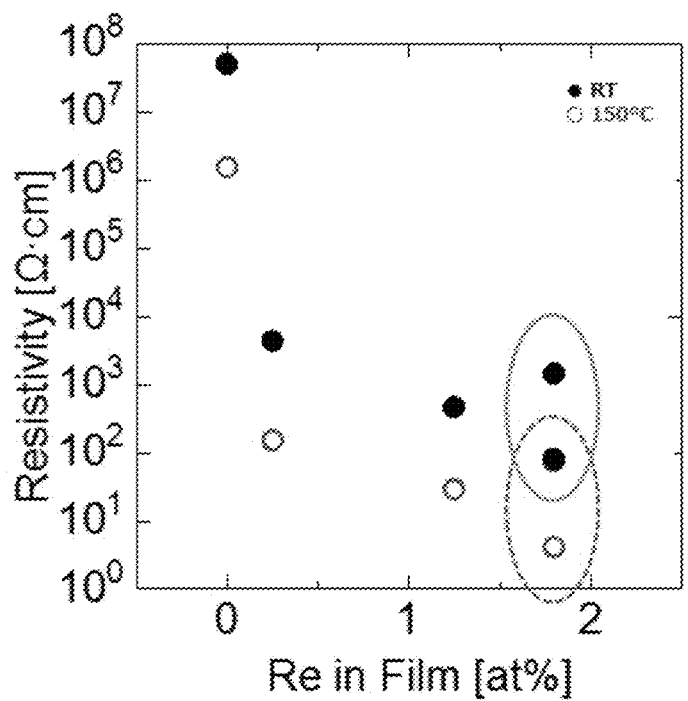
FIG. 4 Resistivity of β-MoO3 vs. doping content of Re in metal oxide thin film in at % (First to fourth embodiment and comparative example 1). Because ReO3 is a volatile oxide, not all of the Re comprised in the sputtered target is included in the deposited thin film.
Figure 5:
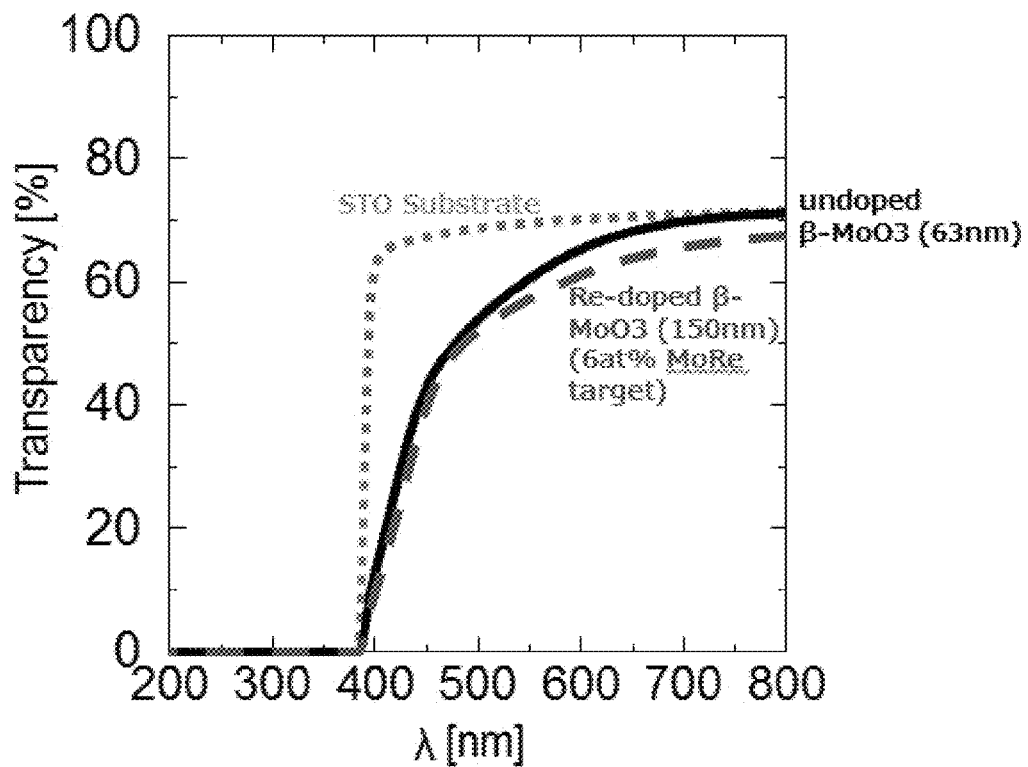
FIG. 5 Optical transmittance of Re-doped β-MoO3 compared to undoped β-MoO3 on a STO substrate (second embodiment).

The thickness of the deposited film was approximately 60 nm. The actual Re content of the film was measured via EDX (energy dispersive X-ray spectrometry, JEOL scanning electron microscopy), and confirmed to be 0 at %. The resistivity of the deposited film was measured via four-point probe measurement at room temperature and 150° C. to be $5\times10^7$ and $1\times10^6$ Ω·cm, respectively. These values can be found also in FIGS. 3 and 4. The optical transmittance of the deposited film was measured via spectrophotometer; the results are shown in FIG. 5.

First Embodiment

A β-MoO3 thin film was deposited via reactive DC magnetron sputtering by using a MoRe alloy target with a Re content of 3 at % on an (100) oriented SrTiO3 substrate. The employed power was 2.5 W/cm$^2$, pressure 1.0 Pa, deposition temperature 200° C. and the Ar flow rate was 10 sccm, $O_2$ flow rate was 2.5 sccm.

The thickness of the deposited film was approximately 150 nm. The actual Re content of the film was measured via EDX being 0.25 at %. The resistivity of the deposited film was measured via four-point probe measurement at room temperature and 150° C. to be $5\times10^3$ and $1\times10^2$ Ω·cm, respectively. These values can be found also in FIGS. 3 and 4.

Second Embodiment

A β-MoO3 thin film was deposited via reactive DC magnetron sputtering by using a MoRe alloy target with a Re content of 6 at % on an (100) oriented SrTiO3 (STO) substrate. The employed power was 2.5 W/cm$^2$, pressure 1.0 Pa, deposition temperature 200° C. and the Ar flow rate was 10 sccm, $O_2$ flow rate was 2.5 sccm.

The thickness of the deposited film was approximately 150 nm. The actual Re content of the film was measured via EDX being 1.81 at %. The resistivity of the deposited film was measured via four-point probe measurement at room temperature and 150° C. to be $9\times10^1$ and 5 Ω·cm, respectively. These values can be found also in FIGS. 3 and 4.

The optical transmittance of the deposited film was measured via spectrophotometer and compared to the film deposited in comparative example 1, the undoped β-MoO3 film. The results, as well as the transmittance of the STO substrate, are shown in FIG. 5 and it can easily be seen, that the internal optical transmittance of both samples (also the doped sample) is more than 90%.

Third Embodiment

A β-MoO3 thin film was deposited via reactive DC magnetron sputtering by using a MoRe alloy target with a Re content of 10 at % on an (100) oriented SrTiO3 substrate. The employed power was 2.5 W/cm$^2$, pressure 1.0 Pa, deposition temperature 200° C. and the Ar flow rate was 10 sccm, $O_2$ flow rate was 3 sccm.

The thickness of the deposited film was approximately 150 nm. The actual Re content of the film was measured via EDX being 1.30 at %. The resistivity of the deposited film was measured via four-point probe measurement at room temperature and 150° C. to be $5\times10^2$ and $5\times10^1$ Ω·cm, respectively. These values can be found also in FIGS. 3 and 4.

Fourth Embodiment

A β-MoO3 thin film was deposited via reactive DC magnetron sputtering by using a MoRe alloy target with a Re content of 15 at % on an (100) oriented SrTiO3 substrate. The employed power was 2.5 W/cm$^2$, pressure 1.0 Pa, deposition temperature 200° C. and the Ar flow rate was 10 sccm, $O_2$ flow rate was 4 sccm.

The thickness of the deposited film was approximately 160 nm. The actual Re content of the film was measured via EDX being 1.80 at %. The resistivity of the deposited film was measured via four-point probe measurement at room temperature and 150° C. to be $1\times10^3$ and $1\times10^2$ Ω·cm, respectively. These values can be found also in FIGS. 3 and 4.

Fifth Embodiment

β-MoO3 thin films were deposited via reactive DC magnetron sputtering by using MoRe alloy targets with Re contents of 0, 3, 6, 10 and 15 at % on $Al_2O_3$ (012) oriented substrates. The employed power was 3.7 W/cm$^2$, pressure 1.0 Pa, deposition temperature 200° C. and the Ar flow rate was 10 sccm, $O_2$ flow rate was fixed to 7 sccm in a systematic approach. After deposition the films were annealed at 200° C. in air for 5 h.

Figure 6:
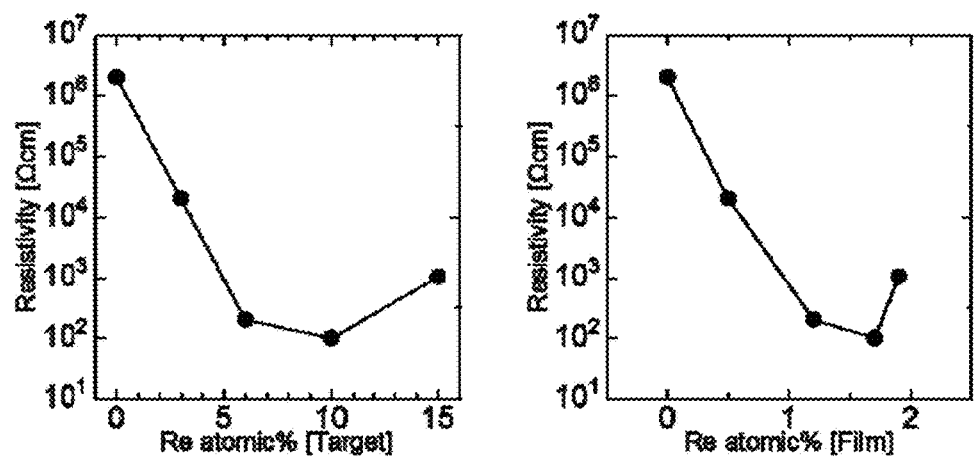
FIG. 6 Resistivity β-MoO3 vs. doping content of Re in sputtered target in at % (left) and Resistivity of β-MoO3 vs. doping content of Re in metal oxide thin film in at % (right) according to the fifth embodiment. Because ReO3 is a volatile oxide, not all of the Re comprised in the sputtered target is included in the deposited thin film.

The thickness of the deposited films was approximately 75 nm. The actual Re content of the film was measured via EDX. The resistivity of the deposited films was measured via four-point probe measurement at room temperature, the values can be found in FIG. 6. The measurement error for these measurements is far below 10 Ω·cm.

With this systematic approach with fixed 02 flow rate of 7 sccm, the resulting resistivities were not as low as in the second embodiment, the lowest resistivity was $1\times10^2$ Ω·cm.

Sixth Embodiment

Figure 7:
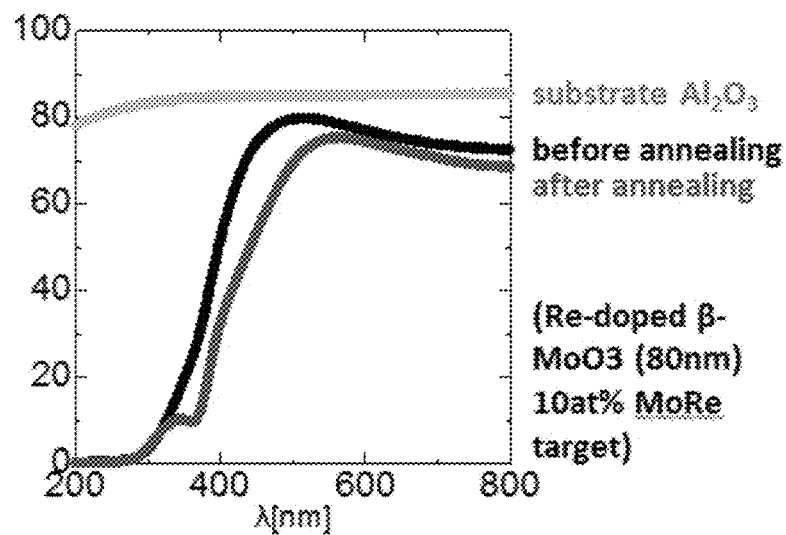
FIG. 7 Optical transmittance of Re-doped β-MoO3 on Al2O3 substrate (sixth embodiment).
Figure 8:
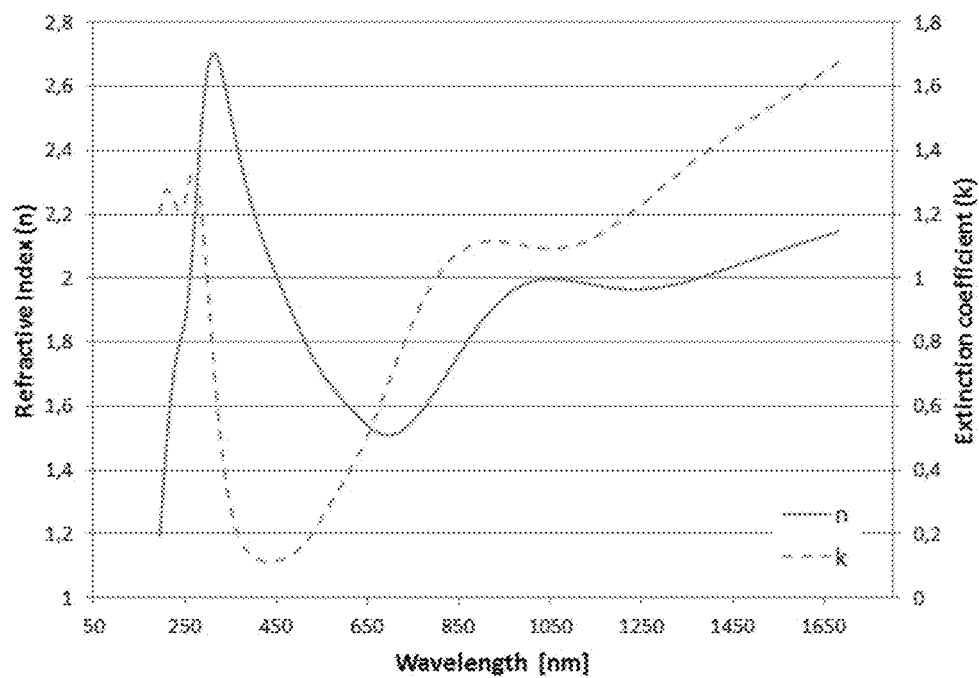
FIG. 8 Refractive index and extinction coefficient of Re-doped β-MoO3 measured via ellipsometry.

A β-MoO3 thin film was deposited via reactive DC magnetron sputtering by using a MoRe alloy target with a Re content 10 at % on an $Al_2O_3$ (012) oriented substrate. The employed power was 2.5 W/cm$^2$, pressure 1.0 Pa, deposition temperature 200° C. and the Ar flow rate was 10 sccm, $O_2$ flow rate was 7 sccm. After deposition the films were annealed at 200° C. in air for 5 h. Transmittance of the as-deposited and annealed film was determined via spectrophotometer. Internal transmittance was determined to be more than 90% for both films. The results are shown in FIG. 7.

The thickness of the deposited films was approximately 80 nm. The resistivity of the deposited film was measured via four-point probe measurement at room temperature to be in the order of $10^2$ Ω·cm.

Seventh Embodiment

A β-MoO3 thin film was deposited via reactive DC magnetron sputtering by using a MoRe alloy target with a Re content 15 at % on a glass substrate. The employed power was 3.7 W/cm$^2$, pressure 1.0 Pa, deposition temperature 200° C. and the Ar flow rate was 10 sccm, O$_2$ flow rate was 6 sccm. The internal transmittance of the film was determined via spectrophotometer. Internal transmittance was determined to be more than 90%.

The thickness of the deposited films was approximately 200 nm. The resistivity of the deposited film was measured via four-point probe measurement at room temperature to be $8\times10^2$ Ω·cm.

Eighth Embodiment

A β-MoO3 thin film was deposited via reactive DC magnetron sputtering by using a MoRe alloy target with a Re content of 10 at % on an (100) oriented SrTiO3 substrate. The employed power was 2.5 W/cm$^2$, pressure 1.0 Pa, deposition temperature 200° C. and the Ar flow rate was 10 sccm, O$_2$ flow rate was 2 sccm.

Figure 1:
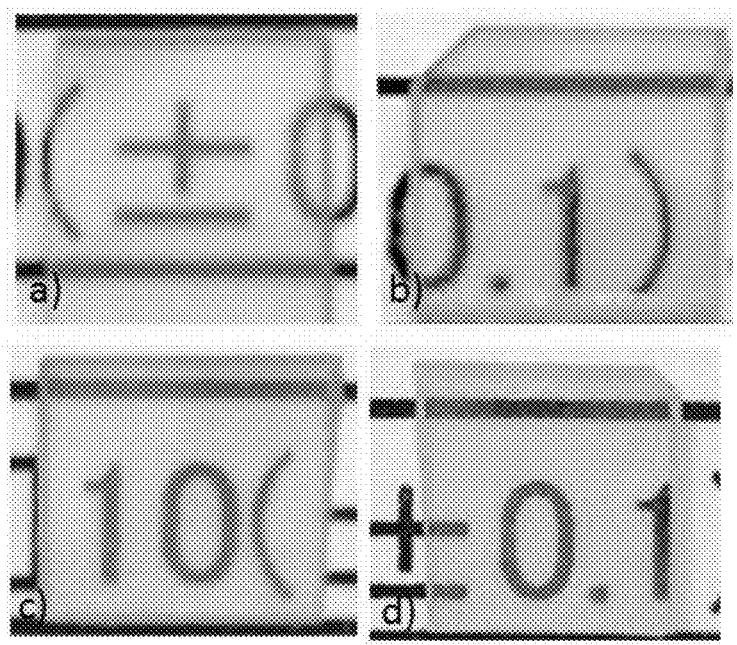
FIG. 1 Metal oxide thin films on substrates according to the first (a), second (b), third (c) and fourth (d) embodiment.
Figure 2:
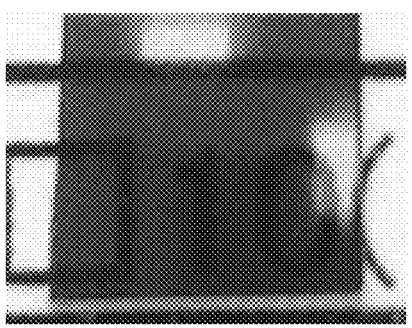
FIG. 2 Metal oxide thin film on substrate according to the eighth embodiment.

The thickness of the deposited film was approximately 250 nm, the film is shown in FIG. 2. Because of the low O$_2$ content, it is possible, that in addition to β-MoO3 the film of this embodiment also comprises small amounts of MoO2 and MoOx (2<x<3).

The invention claimed is:

1. A metal oxide thin film, comprising a film formed of β-MoO$_3$ having a monoclinic β-MoO$_3$ crystal structure and including at least one doping element selected from the group consisting of Re, Mn, and Ru.

2. The metal oxide thin film according to claim 1, wherein a total doping content of said at least one doping element of the group Re, Mn, and Ru lies in a range from 0 to 10 at %.

3. The metal oxide thin film according to claim 2, wherein the total doping content of said at least one doping element of the group Re, Mn, and Ru lies in a range from 1 to 3 at %.

4. The metal oxide thin film according to claim 1, wherein said at least one doping element is Re.

5. The metal oxide thin film according to claim 1, formed to have an electrical resistivity of below 104 Ω·cm.

6. The metal oxide thin film according to claim 5, formed to have an electrical resistivity of below 103 Ω·cm.

7. The metal oxide thin film according to claim 6, formed to have an electrical resistivity of below 102 Ω·cm.

8. The metal oxide thin film according to claim 1, formed to have an internal optical transmittance to light in a visible range of more than 90%.

9. The metal oxide thin film according to claim 1, formed to have a refractive index of between 1.5 and 2.

10. The metal oxide thin film according to claim 1, wherein said film has a thickness of between 50 and 250 nm.

11. The metal oxide thin film according to claim 1, wherein said film has a thickness of between 1 and 15 nm.

12. A method of producing a metal oxide thin film, the method comprising the following steps:
providing a substrate;
providing a molybdenum target and a target comprising at least one element selected from the group consisting of Re, Mn, and Ru, or providing a target comprising molybdenum and at least one element selected from the group consisting of Re, Mn, and Ru; and
sputtering the target or targets in an inert gas atmosphere to form a metal oxide thin film having a monoclinic β-MoO$_3$ crystal structure and including at least one doping element selected from the group consisting of Re, Mn, and Ru.

13. The method according to claim 12, wherein the inert gas atmosphere comprises up to 40 vol % O$_2$.

14. The method according to claim 12, further comprising a step of annealing.

15. A thin film device, comprising at least one metal oxide thin film according to claim 1.

16. The thin film device according to claim 15, which further comprises a substrate of glass or polymer.

17. An electrochromic window device or a touch panel device, comprising a metal oxide thin film according to claim 1.

* * * * *